(12) United States Patent
Takahashi (10) Patent No.: US 7,667,305 B2
(45) Date of Patent: Feb. 23, 2010

(54) SEMICONDUCTOR DEVICE (75) Inventor: Yoshikazu Takahashi, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/232,053

(22) Filed: Sep. 10, 2008

(65) Prior Publication Data
US 2009/0115034 A1    May 7, 2009

(30) Foreign Application Priority Data
Nov. 6, 2007    (JP)    ............................. 2007-288026

(51) Int. Cl.
    *H01L 23/495*    (2006.01)
(52) U.S. Cl. ...................... 257/668; 237/666
(58) Field of Classification Search ................. 257/668, 257/666, 787, 701
See application file for complete search history.

(56) References Cited

U.S. PATENT DOCUMENTS 5,156,716 A * 10/1992 Parthasarathi ................. 216/20
6,320,135 B1 * 11/2001 Saito ........................... 174/250
2006/0181299 A1 * 8/2006 Hirae ........................... 324/765
2008/0004746 A1 * 1/2008 Jahnke et al. ................ 700/229
2008/0251947 A1 * 10/2008 Sakata et al. ................. 257/783
2009/0133367 A1 * 5/2009 Gregerson et al. ............. 53/453

FOREIGN PATENT DOCUMENTS

| JP | 06-310570 | 11/1994 |
| JP | 2001-338950 | 12/2001 |
| JP | 2003-229441 | 8/2003 |
| JP | 2004-165615 | 6/2004 |

* cited by examiner

*Primary Examiner*—S. V Clark
(74) *Attorney, Agent, or Firm*—Rabin & Berdo, PC

(57) ABSTRACT

A semiconductor device according to the present invention includes a base tape (film carrier tape); a semiconductor chip mounted on the base tape; conducting leads formed on the base tape to be connected to the semiconductor chip; input terminals and output terminals connected to the conducting leads; and a protecting layer formed to cover the conducting leads completely. The base tape is provided at its side edges with roller-contact regions, where carrier rollers are to be in contact with. No holes and no unevenness area is formed on the roller-contact regions.

5 Claims, 8 Drawing Sheets

COF

COF

FIG. 7

TCP

FIG. 8

TCP

SEMICONDUCTOR DEVICE

CROSS REFERENCE TO RELATED APPLICATION

This application claims the priority of Application No. 2007-288026, filed Nov. 6, 2007 in Japan, the subject matter of which is incorporated herein by reference.

TECHNICAL FIELD OF THE INVENTION

The present invention relates to a semiconductor device fabricated using a tape-shaped base member. In more detail, the present invention relates to a semiconductor device (package) of a structure of COF (Chip On Film), TCP (Tape Carrier Package) or the like.

BACKGROUND OF THE INVENTION

According to TCP and COF using a tape-shaped base member, a semiconductor package is fabricated, for example, using a polyimide tape having a width of about 35 mm. A copper foil or a copper plating layer is formed on the polyimide tame to form an electric circuit thereon. According to a TCP type of semiconductor package, a polyimide tape is removed at an area for a semiconductor chip, and copper leads connected to the semiconductor chip are exposed, which is called "flying lead structure". On the other hand, according to a COF type of semiconductor package, a polyimide tape remains at an area for a semiconductor chip, which is not a "flying leads structure".

Figure 1:
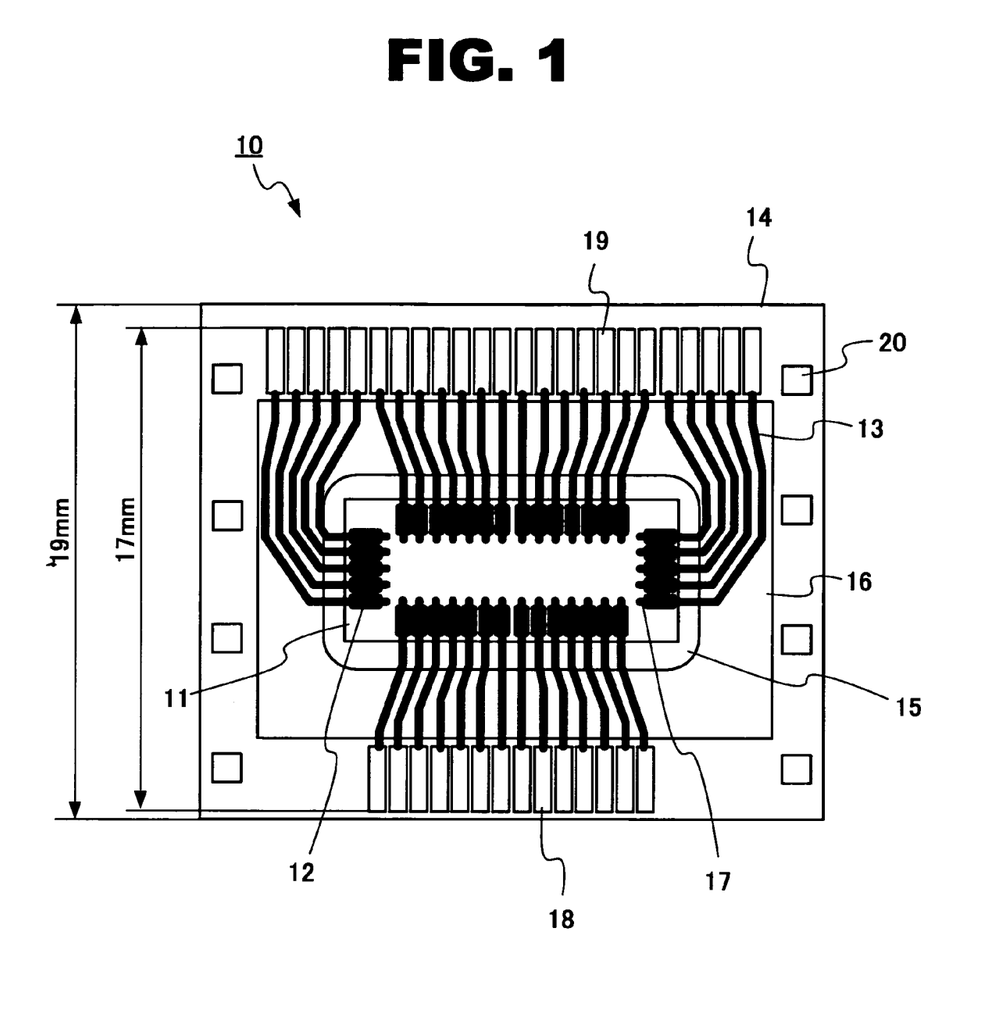
FIG. 1 is a plan view (perspective view) showing a conventional COF package.
Figure 2:
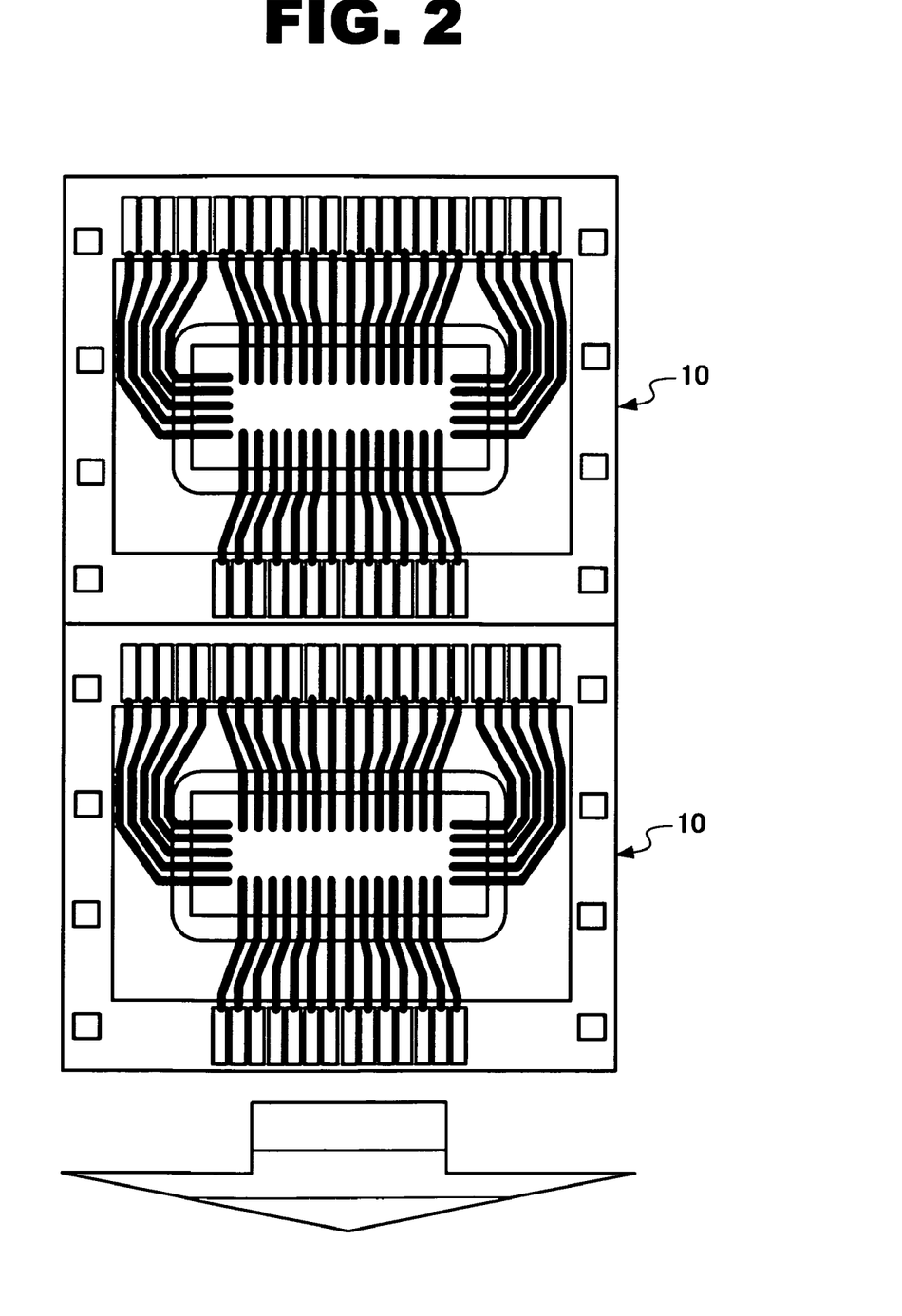
FIG. 2 is a plan view showing COF packages shown in FIG. 1, which are mounted on a base tape.
Figure 3:
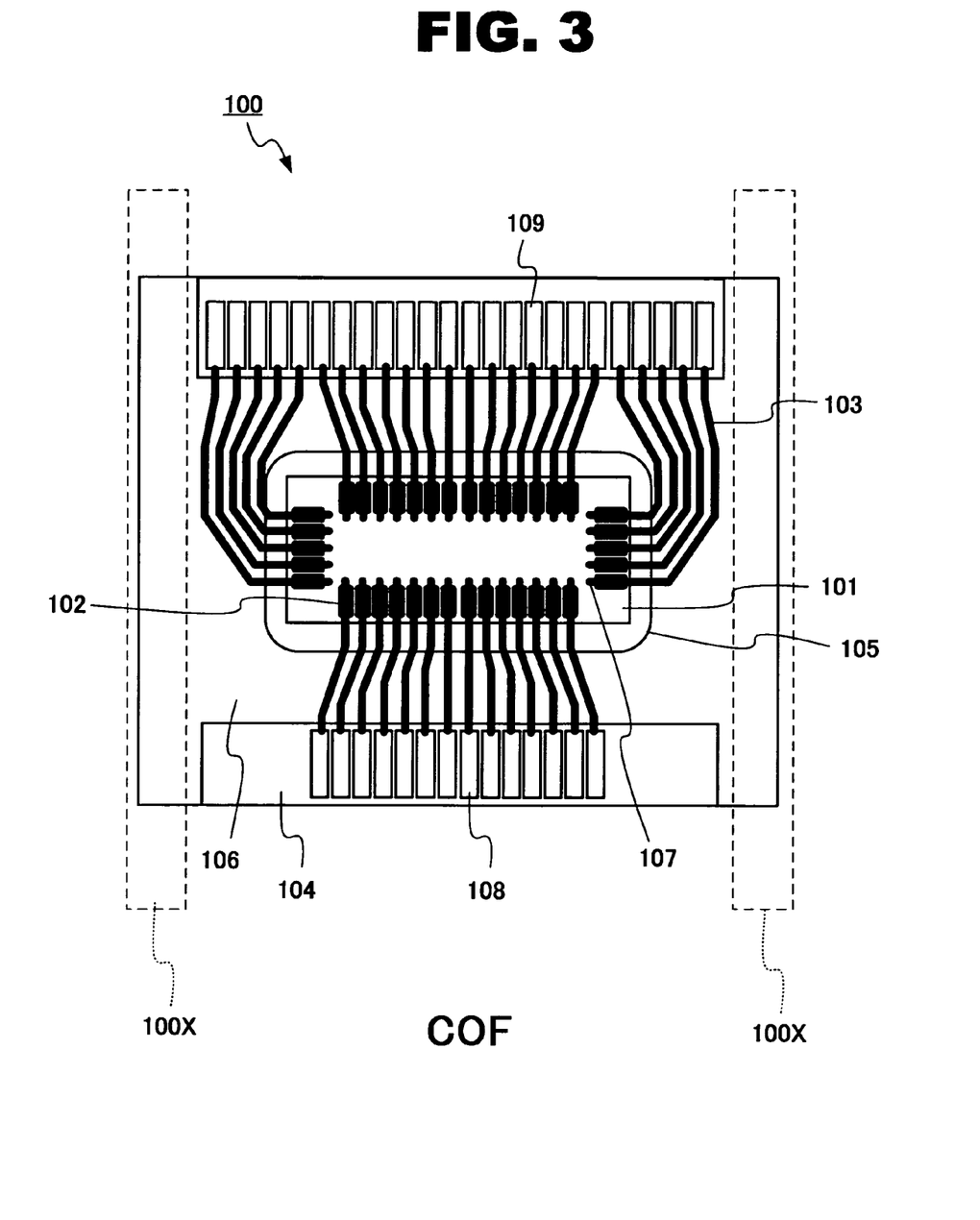
FIG. 3 is a plan view (perspective view) showing a COF package according to a first preferred embodiment of the present invention.

FIGS. 1 and 2 show a conventional COF type of semiconductor package 10, hereinafter called "COF package". FIG. 1 is a perspective view, while FIG. 3 shows a couple of COF package 10 connected to each other. In FIG. 1, a reference numeral 11 represents a semiconductor chip; and a reference numeral 12 represents bump electrodes formed on the semiconductor chip 11. A reference numeral 14 represents a flexible base film (base tape), which may be made of an insulating material such as a polyimide resin and a glass epoxy resin; a reference numeral 13 represents conductive leads formed on the base film 14; and a reference numeral 16 represents a solder resist for protecting the conductive leads. The solder resist 16 is formed, as shown in FIG. 1, to cover a surface of the package except an area on ends of the conductive leads 13 and surroundings.

Inner leads 17 are connected to the bump electrodes in a thermocompression bonding process. A sealing resin 15 is formed on upper and side surfaces of the semiconductor chip 11 to cover the semiconductor chip. A reference numeral 18 represents input terminals to be connected to an input circuit board; and a reference numeral 19 represents output terminals to be connected to an output circuit board. The tape (base film) is proved at its sides with perforations holes (sprocket holes) 20, which are used when conveying the base film. The perforation hoes 20 are arranged to have a pitch of 4.75 mm, in general.

An individual COF package 10 has a length of 17 mm. However, since COF packages are formed on a base tape, as shown in FIG. 2, each of divided COF packages has a length of 19 mm. That is because, the pitch of the perforation holes 20 is 4.75 mm and four perforation holes are arranged on each COF package. Practically, base film is shaped to have a length of 40 to 80 m with a number of COF packages each having a length of 19 mm.

As described above, according to the conventional COF package, even thought an effective package size (length) is 17 mm, the perforation holes 20 cause a worthless space corresponding to a multiple of 4.75 mm. In other words, each of the COF package is shaped to have a length of 19 mm including a worthless length of 2 mm.

For conveying a tape carrier, in addition to the above-describe type of structure using sprocket holes, a type of device which is carried using rollers has been proposed. In patent applications, JPH06-310570A and JP2003-229441A, a tape carrier is conveyed by a roller mechanism.

[Patent Publication 1] JPH06-310570A
[Patent Publication 2] JP2003-229441A

According to a structure shown in Patent Publication 1, since sprocket holes are provided at a region where a roller is to be in contact with, there were the following problems.

(1) The strength of a tape is lowered by sprocket holes.
(2) Unevenness over the sprocket holes makes vibration in a conveying process, and therefore, a tape is hardly conveyed smoothly.

Further, according to a structure shown in Patent Publication 2, the same or similar problems as the Patent Publication 1 arise.

OBJECTS OF THE INVENTION

It is an object of the present invention is to provide a semiconductor package structure in which flexibility of package size may be improved.

Another object of the present invention is to provide a semiconductor package structure in which reliability of conveying process is improved.

Still another object of the present invention is to provide a semiconductor package structure which may be fabricated easily with simpler process with lower manufacturing costs.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to the present invention, a semiconductor device includes a base tape (film carrier tape); a semiconductor chip mounted on the base tape; conducting leads formed on the base tape to be connected to the semiconductor chip; input terminals and output terminals connected to the conducting leads; and a protecting layer formed to cover the conducting leads completely. The base tape is provided at its side edges with roller-contact regions, where carrier rollers are to be in contact with. No holes and no unevenness area is formed on the roller-contact regions.

According to the present invention, since no sprocket hole is formed on a base tape, an actual package size may be selected and designed flexibly. Usually, a COF has a length of 40 m. According to conventional technology, shown in FIGS. 1 and 2, each package occupies a length of 19 mm and 2105 pieces of packages can be mounted on the tape of 40 m long. On the other hand, according to the present invention, each package may have a length of 17.1 mm, and 2339 pieces of packages (COFs 100) may be mounted on the tape of 40 m long. Namely, according to the present invention, as compared with the conventional technology, 11% of more packages can be formed on the same length of tape; and therefore, manufacturing costs may be reduced and fabrication effectiveness may be improved.

Further, according to the present invention, since no sprocket hole is formed on a base tape, the tape may be shaped flat at an area which is to be in contact with a roller. Therefore, a possibility of miss conveying can be reduced. In addition, according to the present invention, a process for forming sprocket holes can be omitted, and as a result, a package may be fabricated easily with simpler process with lower manufacturing costs. Still further, according to the present invention, since no sprocket hole is formed on a base tape, a base tape has a higher strength at edges.

If a base tape (base tape) is provided with an area for contact with a roller, which is covered with a protection layer, such as a solder resist, strength of the base tape may be increased.

DESCRIPTION OF REFERENCE NUMERALS 100, 200: COF package
101, 301: Semiconductor Package
103, 303: Conducting Lead
104, 304: Base tape
106, 206, 306, 406: Solder Resist
100X, 200X, 300X, 400X: Area of Roller Contact
300, 400: TCP

DETAILED DISCLOSURE OF THE INVENTION

In the following detailed description of the preferred embodiments, reference is made to the accompanying drawings which form a part hereof, and in which is shown by way of illustration specific preferred embodiments in which the inventions may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present inventions. The following detailed description is, therefore, not to be taken in a limiting sense, and scope of the present inventions is defined only by the appended claims.

Figure 4:
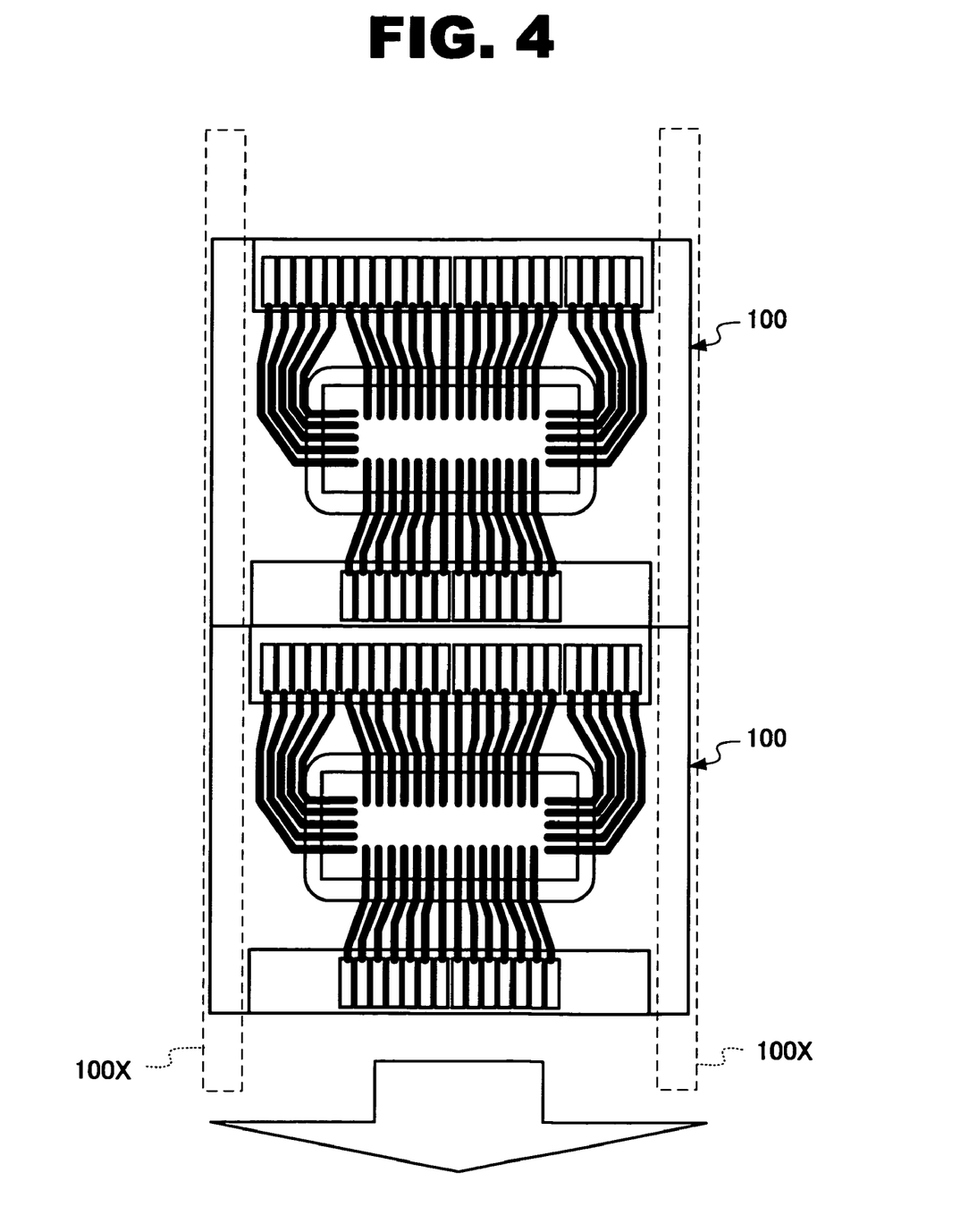
FIG. 4 is a plan view showing COF packages shown in FIG. 3, which are mounted on a base tape.

FIG. 3 is a plan view (perspective view) showing a COF package according to a first preferred embodiment of the present invention. FIG. 4 is a plan view showing COF packages shown in FIG. 3, which are mounted on a base tape. A semiconductor package (COF package) 100 according to the present embodiment, includes a base tape (film carrier tape) 104; a semiconductor chip 101 mounted on the base tape 104; conducting leads 103 formed on the base tape 104 to be connected to the semiconductor chip 101; input terminals 108 and output terminals 109 connected to the conducting leads 103; and a protecting layer (solder resist) 106 formed to cover the conducting leads 103 to protect the conducting leads 103. The protecting layer 106 is formed not to cover the ends of the conducting leads 103 and their surroundings.

The base tape 104 is a flexible tape and may be formed of an insulating material, such as a polyimide resin, a glass epoxy resin, and the like. The base tape 104 includes roller-contact regions 100X, where carrier rollers are to be in contact with. The roller-contact regions 100X are arranged about right and left edges of the base tape 104. The roller-contact regions 100X are formed to be flat in level and not provided with holes, such as perforation holes, or unevenness parts.

The roller-contact regions 100X are completely covered with the protecting layer 106. That is, the protecting layer 106 covers the conducting leads 103 and extends to the edges of the base tape 104.

Bump electrodes 102 are formed on the semiconductor chip 101 and are connected to the inner leads 107. The inner leads 107 are connected to the bump electrodes 102 by heating and applying pressure to them. Upper and side surfaces of the semiconductor chip 101 are covered with a sealing resin 105 for protection. The input terminals 108 are connected to an input-side circuit board while the output terminals 109 are connected to an output-side circuit board.

In FIG. 4, each package 100 has a length of about 17 mm. Next two packages 200 has a distance between them, and therefore, an actual package size (length) would be 17 mm+α (alpha). Here, a value α (alpha) is about 0.1 mm. On the other hand, according to a conventional structure, shown in FIGS. 1 and 2, the size of a semiconductor chip is defined by a multiple of perforation holes. According to the present invention, no perforation holes are formed on the base tape, a semiconductor package may have more flexibility in dimension.

Usually, a COF has a length of 40 m. According to conventional technology, shown in FIGS. 1 and 2, each package occupies a length of 19 mm and 2105 pieces of packages can be mounted on the tape of 40 m long. On the other hand, according to the present invention, each package may have a length of 17.1 mm, and 2339 pieces of packages (COFs 100) may be mounted on the tape of 40 m long. Namely, according to the present invention, as compared with the conventional technology, 11% of more packages can be formed on the same length of tape; and therefore, manufacturing costs may be reduced and fabrication effectiveness may be improved.

Figure 5:
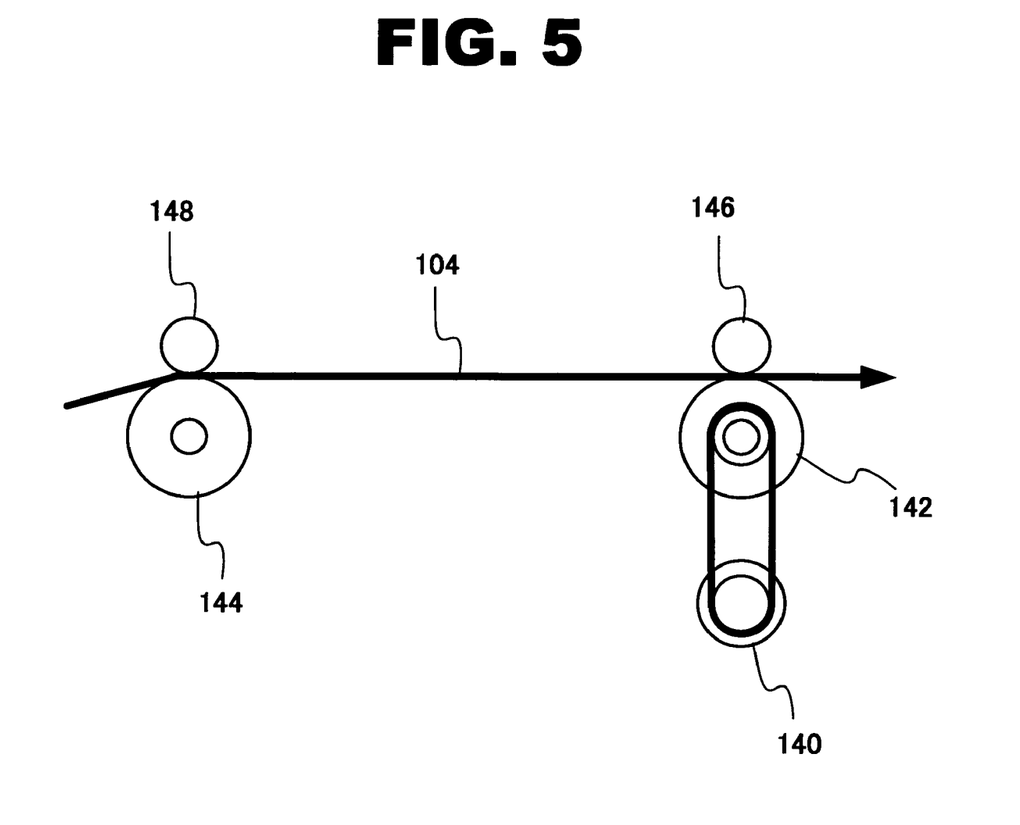
FIG. 5 is an explanatory view illustrating a general structure of a carrier device, which is applicable to the present invention.

FIG. 5 is an explanatory view illustrating a general structure of a carrier device, which is applicable to the present invention. In FIG. 5, a drive roller 142 is rotated by a servo-motor 140. A TAB tape (base tape 104), which is a tape carrier for semiconductor devices, is gripped and carried between the drive roller 142 and a support roller 146, which is opposing to the drive roller 142. When the TAB tape 104 is carried, a free roller 144 is rotated. The free roller 144 opposed to another support roller 148.

The rollers 142, 144, 146 and 148 are in contact with the roller-contact regions 100X of the base tape 104. According to the present invention, since no sprocket hole is formed on the base tape 104, the tape may be shaped flat at the roller-contact regions 100X. Therefore, a possibility of miss conveying (carrying) of the base tape 104 can be reduced. In addition, according to the present invention, a process for forming sprocket holes can be omitted, and as a result, a package may be fabricated easily with simpler process with lower manufacturing costs. Still further, according to the present invention, since no sprocket hole is formed on the base tape 104, the base tape 104 has a higher strength at edges.

Further, since the roller-contact regions 100X are covered completely with the protection layer 106, such as a solder resist, mechanical strength of the roller-contact regions 100X can be increased.

Figure 6:
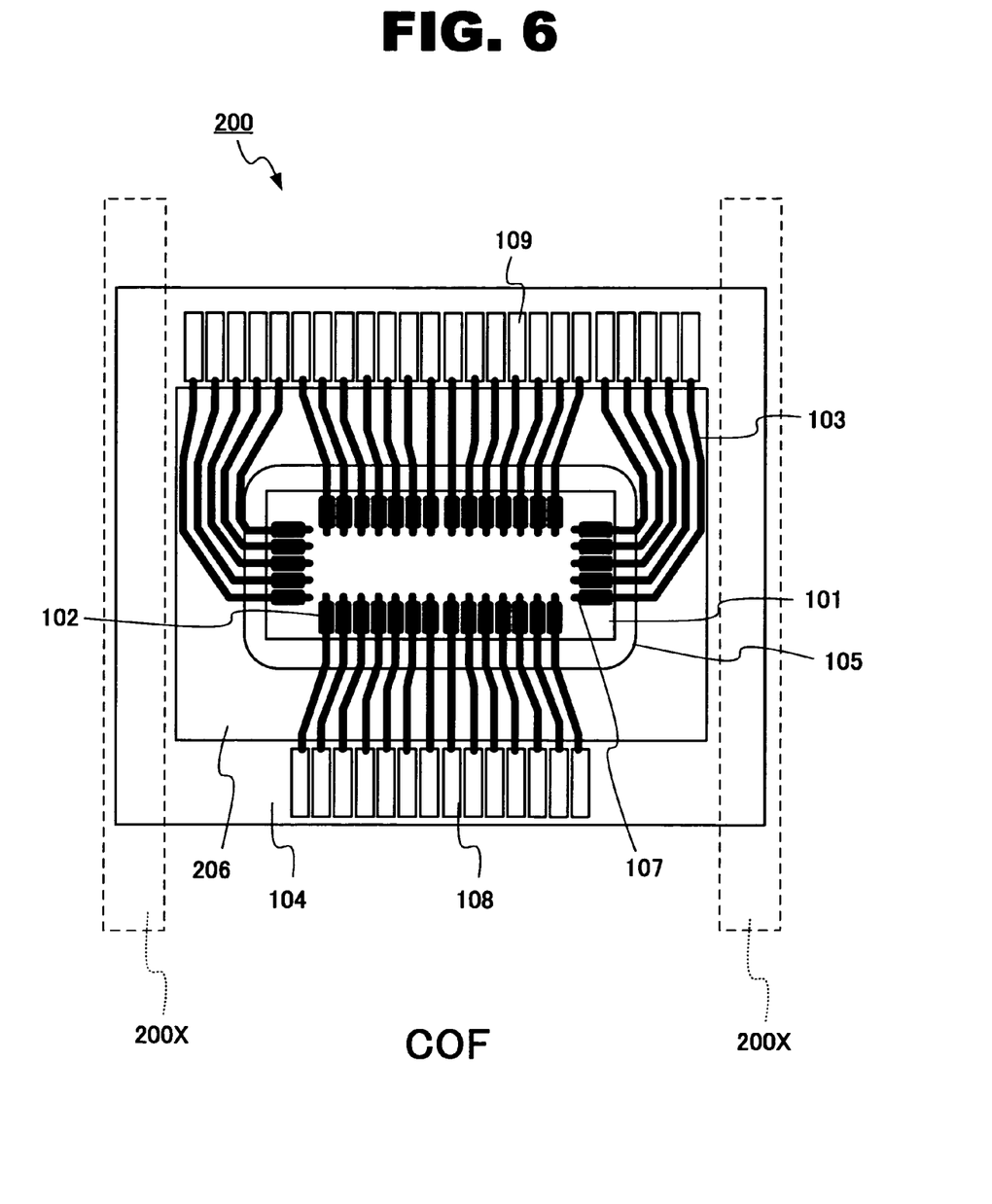
FIG. 6 is a plan view (perspective view) showing a COF package according to a second preferred embodiment of the present invention.

FIG. 6 is a plan view (perspective view) showing a COF package 200 according to a second preferred embodiment of the present invention. According to the second preferred embodiment, a solder resist 206 does not extend to edges of a base tape 104 so that the solder resist 206 does not reach roller-contact regions 200X. In other words, carrying rollers are in contact with a surface of the base tape 104 directly. The carrier device, shown in FIG. 5, is also applicable to the second preferred embodiment. Other components are the same as those of the first preferred embodiment, and the same description is not repeated.

Figure 7:
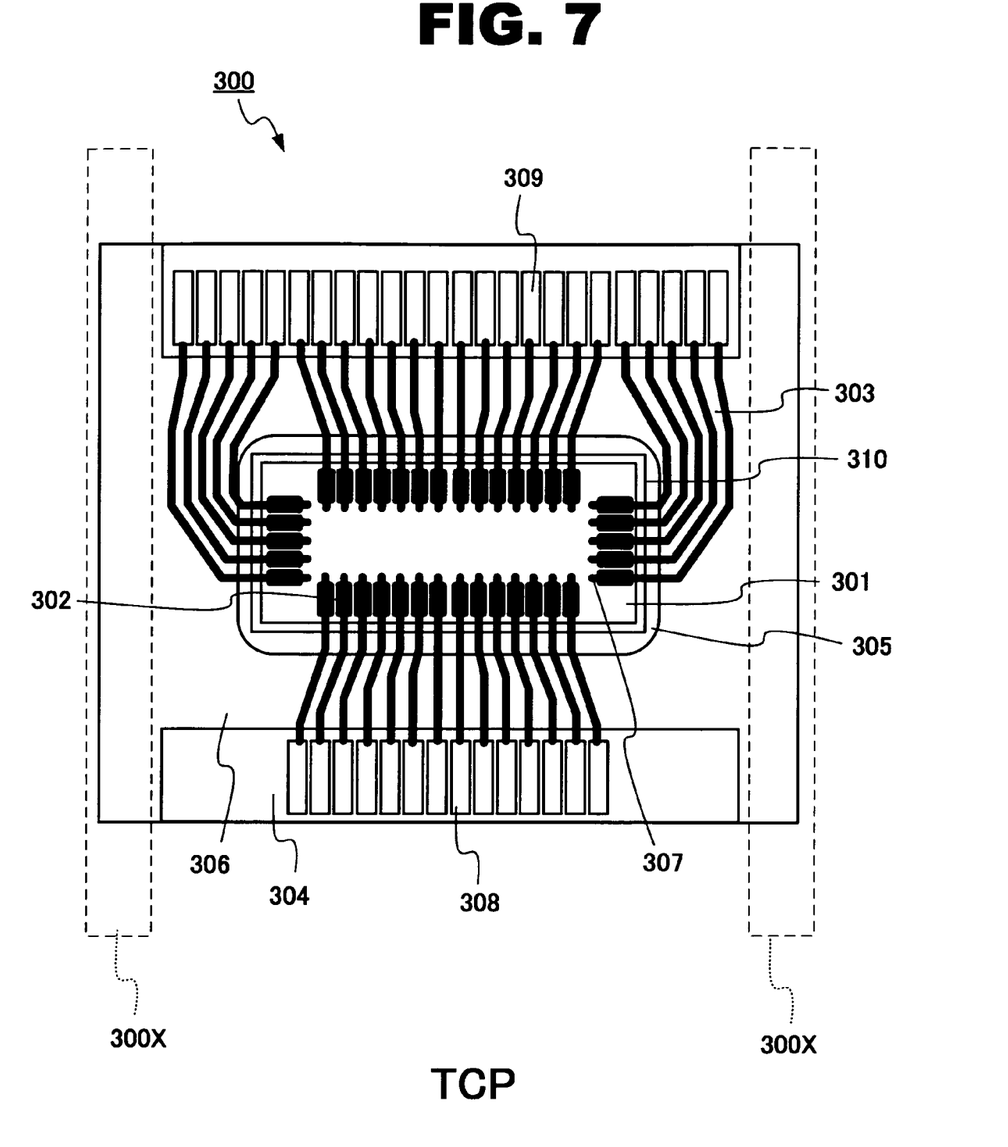
FIG. 7 is a plan view (perspective view) showing a TCP according to a third preferred embodiment of the present invention.

FIG. 7 is a plan view (perspective view) showing a TCP 300 according to a third preferred embodiment of the present invention. A semiconductor package (TCP) 300 according to the present embodiment, includes a base tape (film carrier tape) 304; a semiconductor chip 301 mounted on the base tape 304; conducting leads 303 formed on the base tape 304 to be connected to the semiconductor chip 301; input terminals 308 and output terminals 309 connected to the conducting leads 303; and a protecting layer (solder resist) 306 formed to cover the conducting leads 303 to protect the conducting leads 303. The base tape 304 is provided with a device hole in which the semiconductor chip 301 is mounted.

In the same manner as the first and second preferred embodiments, the base tape 304 is a flexible tape and may be formed of an insulating material, such as a polyimide resin, a glass epoxy resin, and the like. The base tape 304 includes roller-contact regions 300X, where carrier rollers are to be in contact with. The roller-contact regions 300X are arranged about right and left edges of the base tape 304. The roller-contact regions 300X are formed to be flat in level and not provided with holes, such as perforation holes, or unevenness parts.

The roller-contact regions 300X are completely covered with the protecting layer 306. That is, the protecting layer 306 covers the conducting leads 303 and extends to the edges of the base tape 304.

Bump electrodes 302 are formed on the semiconductor chip 301 and are connected to the inner leads 307. The inner leads 307 are connected to the bump electrodes 302 by heating and applying pressure to them. Upper and side surfaces of the semiconductor chip 301 are covered with a sealing resin 305 for protection. The input terminals 308 are connected to an input-side circuit board while the output terminals 309 are connected to an output-side circuit board. The carrier device, shown in FIG. 5, is also applicable to the second preferred embodiment.

According to the third preferred embodiment, the same advantages as the first preferred embodiments can be obtained. According to the third preferred embodiment, since no sprocket hole is formed on the base tape 304, the tape 304 may be shaped flat at the roller-contact regions 300X. Therefore, a possibility of miss conveying (carrying) of the base tape 304 can be reduced. In addition, according to the present invention, a process for forming sprocket holes can be omitted, and as a result, a package may be fabricated easily with simpler process with lower manufacturing costs. Still further, according to the present invention, since no sprocket hole is formed on the base tape 304, the base tape 304 has a higher strength at edges.

Figure 8:
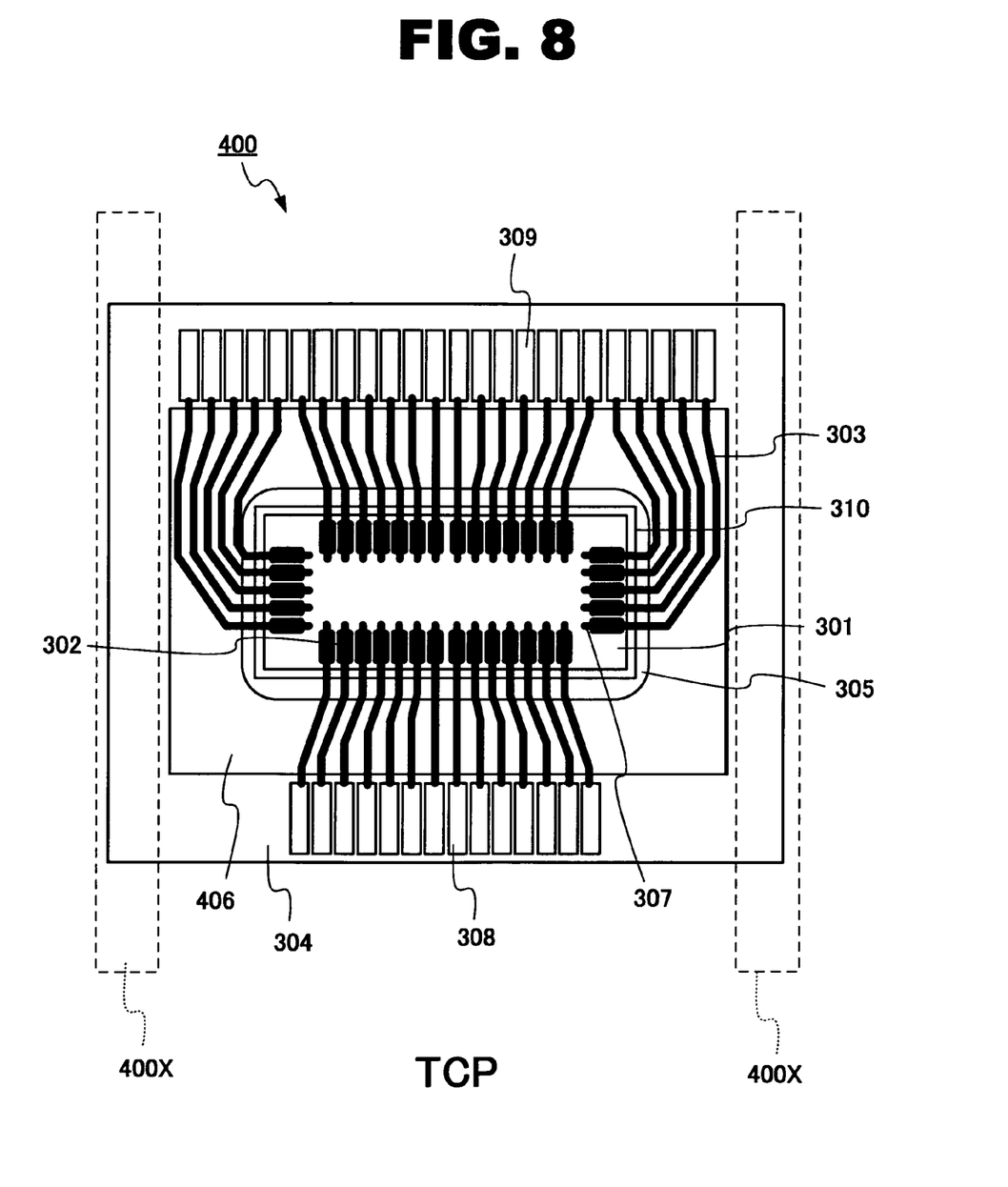
FIG. 8 is a plan view (perspective view) showing a TCP according to a fourth preferred embodiment of the present invention.

FIG. 8 is a plan view (perspective view) showing a TCP 400 according to a fourth preferred embodiment of the present invention. According to a semiconductor package (TCP) 400, a solder resist 306 does not extend to side edges of the base tape 304. In other words, roller-contact regions 400X are not covered with the solder resist 306, so that carrier rollers are in contact with the surface of the base tape 304 directly. The carrier device, shown in FIG. 5, is also applicable to the fourth preferred embodiment. Other components and advantages are the same as those of the above described embodiments, and the same description is not repeated.

What is claimed is:

1. A semiconductor device, comprising:
   a base tape (film carrier tape);
   a semiconductor chip mounted on the base tape;
   conducting leads formed on the base tape to be connected to the semiconductor chip;
   input terminals and output terminals connected to the conducting leads; and
   a protecting layer formed to cover the conducting leads completely,
   wherein the base tape is provided at its side edges with roller-contact regions, where carrier rollers are to be in contact with, and
   no holes and no unevenness area is formed on the roller-contact regions.

2. A semiconductor device, according to claim 1, wherein the roller-contact regions of the base tape is completely covered with the protecting layer.

3. A semiconductor device, according to claim 1, wherein the roller-contact regions of the base tape is not covered with the protecting layer.

4. A semiconductor device, according to claim 1, wherein the semiconductor device is of a COF (Chip On Film) type.

5. A semiconductor device, according to claim 1, wherein the semiconductor device is of a TCP (Tape Carrier Package) type.

* * * * *